United States Patent
Jin et al.

(10) Patent No.: US 7,332,852 B2
(45) Date of Patent: Feb. 19, 2008

(54) ONE-WAY TRANSPARENT OPTICAL SYSTEM HAVING LIGHT ABSORPTION ELEMENTS AND LIGHT REFRACTING STRUCTURES

(75) Inventors: Young-Gu Jin, Suwon (KR); Byoung-Ho Cheong, Seoul (KR); Hansol Cho, Yongin-si (KR); Joon-Yong Park, Suwon (KR); Jongsun Lim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 385 days.

(21) Appl. No.: 10/882,306

(22) Filed: Jul. 2, 2004

(65) Prior Publication Data

US 2006/0001341 A1 Jan. 5, 2006

(51) Int. Cl.
*H01J 5/16* (2006.01)

(52) U.S. Cl. ........................................ 313/110; 313/112

(58) Field of Classification Search ................ 313/110, 313/111, 112, 116
See application file for complete search history.

(56) References Cited

U.S. PATENT DOCUMENTS

2003/0201969 A1* 10/2003 Hiyama et al. ............. 345/102

FOREIGN PATENT DOCUMENTS

JP 2002-365731 A 12/2002
KR 10-0219143 B1 6/1999

OTHER PUBLICATIONS

Notice to Submit Response for Application No. 10-2004-0082073, dated Mar. 31, 2006.

* cited by examiner

*Primary Examiner*—Joseph Williams
*Assistant Examiner*—Bumsuk Won
(74) *Attorney, Agent, or Firm*—Sughrue Mion, PLLC

(57) ABSTRACT

An apparatus and method for microstructures of a display device which focus external light toward light-absorption regions to enhance brightness and contrast of the display device. The display device includes a light absorption layer disposed to one side of a light emission layer. The light absorption layer includes light refracting structures and light absorption elements, wherein each of the light absorption elements is positioned in the light refracting structures. The light directing structures substantially direct incident light toward one of the plurality of light absorption elements positioned therein to reduce the reflection of external light.

21 Claims, 11 Drawing Sheets

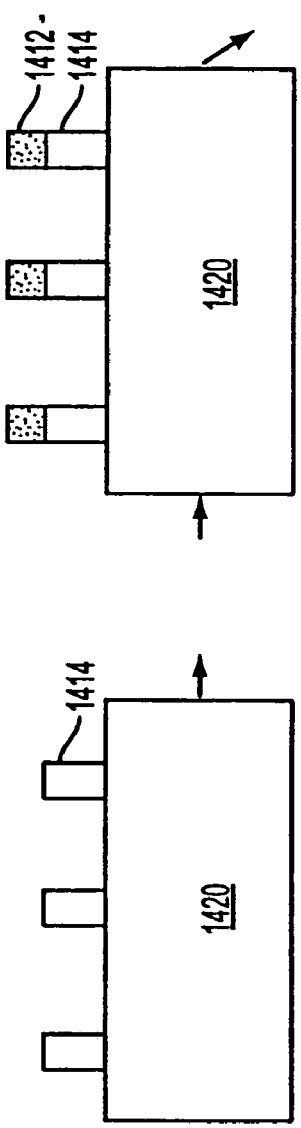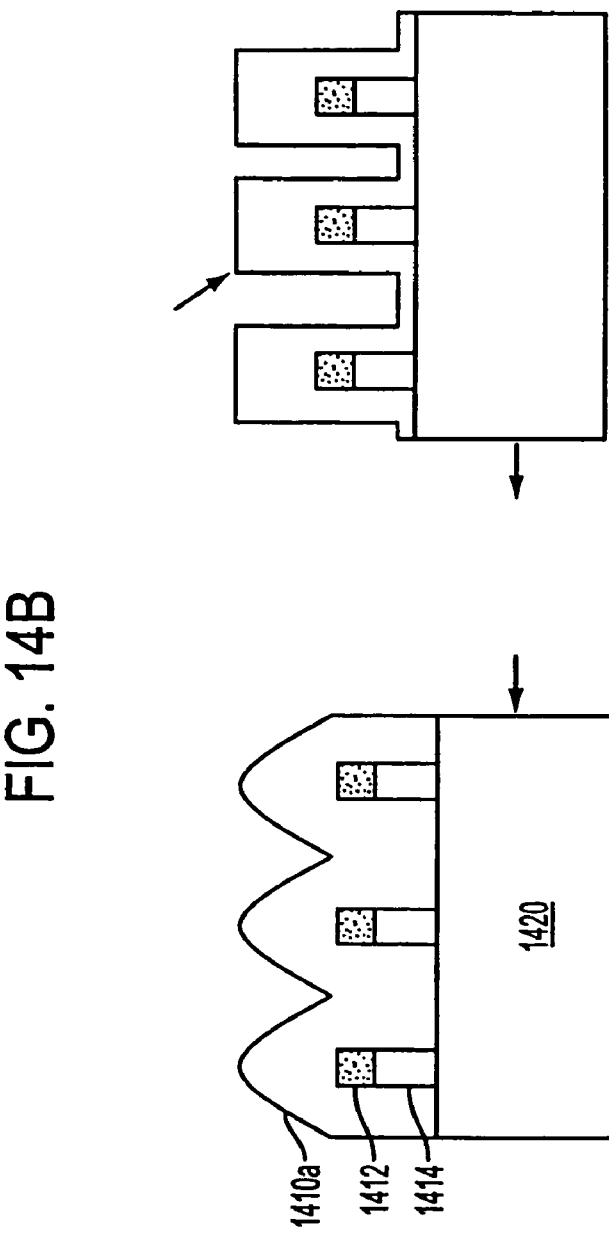

ONE-WAY TRANSPARENT OPTICAL SYSTEM HAVING LIGHT ABSORPTION ELEMENTS AND LIGHT REFRACTING STRUCTURES

BACKGROUND OF THE INVENTION

1. Field of the Invention

Apparatuses and methods consistent with the present invention relate to light-absorption structures for reducing the transmission of light. Specifically, the apparatuses and methods relate to microstructures of a display device which focus external light toward light-absorption regions to enhance brightness and contrast of the display device.

2. Description of the Related Art

Direct light-emitting displays such as organic electroluminescent displays have two problems, namely, contrast reduction and glare from external environmental light. To reduce the effects of glare, film-type anti-reflection coatings or spherical anti-glare coatings are used. A circular polarizer is also used to lessen the effects of contrast reduction by intercepting the reflection of external light from the metal electrode. However, a circular polarizer can significantly decrease the amount of light emitted from the light emission layer of a display.

SUMMARY OF THE INVENTION

To solve the above problems, the present invention is conceived. A novel optical system for reducing the reflection of light is provided.

An embodiment of the present invention includes an optical apparatus comprising: a plurality of light refracting structures wherein each of the plurality of light refracting structures refracts incident light toward a focal region; and a plurality of light absorption elements wherein each of the plurality of light absorption elements is disposed at about a focal region of a corresponding one of the plurality of light refracting structures.

An aspect of the present invention includes a display device having a light emission layer, the display device comprising: a light absorption layer disposed to one side of the light emission layer, said light absorption layer comprising: a plurality of light refracting structures; and a plurality of light absorption elements, wherein each of the plurality of light absorption elements is positioned in a corresponding one of the plurality of light refracting structures and each of the plurality of light refracting structures substantially directs incident external light toward one of the plurality of light absorption elements positioned therein.

Another aspect of the present invention is a method of absorbing light, the method comprising: receiving first light at light refraction structures as received light; transmitting at least a portion of the received first light as transmitted light; refracting said transmitted light toward corresponding focal areas of said light refraction structures; and absorbing said transmitted light at the corresponding focal areas.

Yet another aspect of the present invention is a method of making a light absorption layer comprising: forming light absorption cores; forming a shell on each of the light absorption cores to form light absorption elements; and distributing said light absorption elements on a light transmission layer.

An alternative aspect of the present invention is a method of making a light absorption layer comprising: forming light absorption cores; distributing said light absorption cores on a light transmission layer; and coating said light absorption cores to form projecting structures at each of said light absorption cores.

Another method of making the present invention is a method of making a light absorption layer comprising: forming a light absorption layer on a light transmission layer; patterning said light absorption layer to form a plurality of light absorption elements on said light transmission layer; coating said plurality of light absorption elements to form a plurality of projecting structures at said plurality of light absorption elements, wherein each of the plurality of projecting structures refracts incident light toward a corresponding one of the light absorption elements.

Yet another method of making the present invention is a light absorption layer comprising: patterning a layer disposed above a light transmission layer into a pattern; forming a plurality of light absorption elements on said pattern; coating said plurality of light absorption elements to form a plurality of projecting structures at said plurality of light absorption elements, wherein each of the plurality of projecting structures refracts incident light toward a corresponding one of the light absorption elements.

BRIEF DESCRIPTION OF THE DRAWINGS

The above and other aspects of the present invention will become more apparent by describing in detail exemplary embodiments thereof with reference to the attached drawings in which:

FIG. 14A-D are also cross sectional views of yet another method of making the present invention.

DETAILED DESCRIPTION OF THE INVENTION

An apparatus according to one aspect of the present invention includes projecting structures formed on a light transmitting surface of a display device. Each of the projecting structures includes a light absorption region. Much of the external light incident on the projecting structures is refracted toward the light absorbing regions to be absorbed. Most of the internal light generated by the light transmitting surface below the projecting structures, however, passes through the projecting structures.

Figure 1:
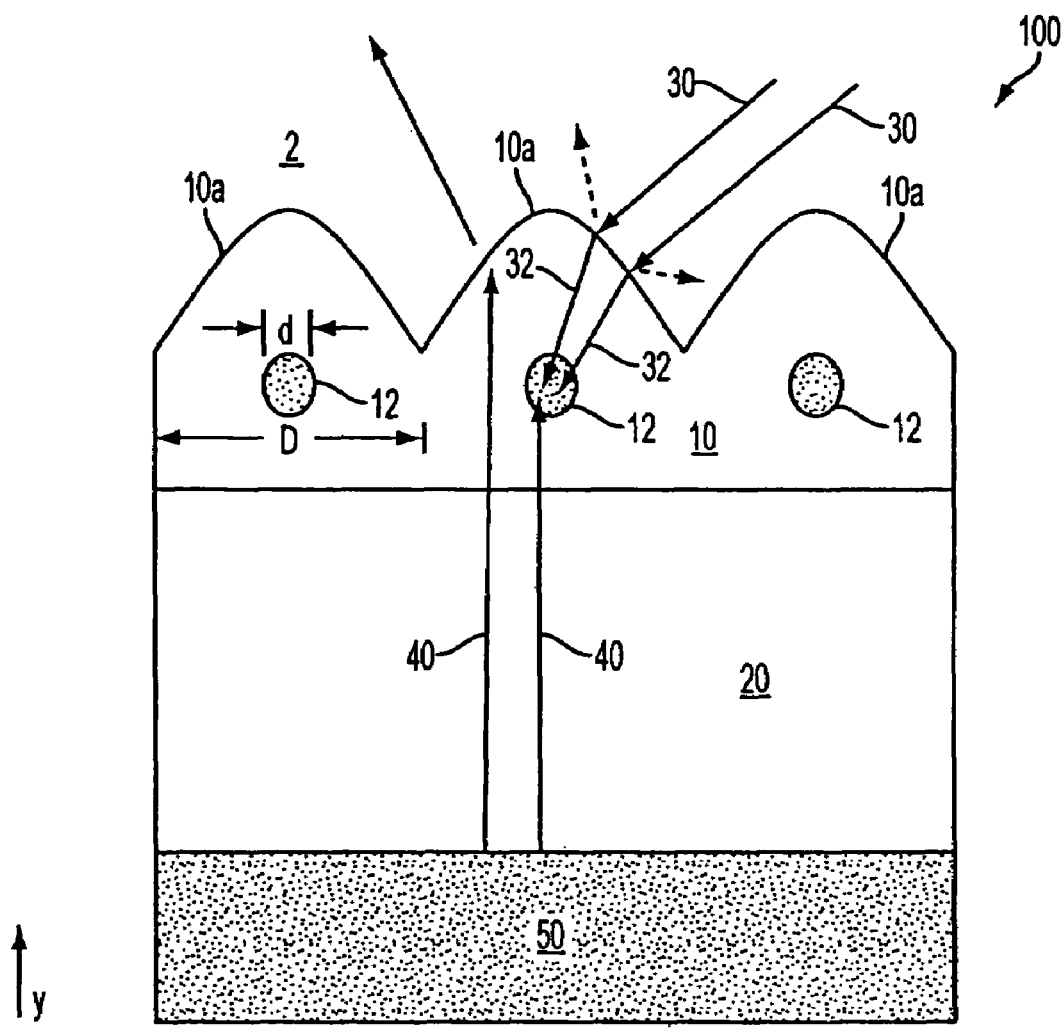
FIG. 1 is a cross sectional view according to an embodiment of the invention.
Figure 2A:
FIGS. 2A-C are cross sectional views of the various embodiments of projecting structures.
Figure 2B:
Figure 2C:

In FIG. 1, an exemplary embodiment of the present invention is shown. FIG. 1 shows an optical system 100 having a light absorption layer 10, a light transmission layer 20, and a light emission layer 50. The light transmission layer 20 is disposed above the light emission layer 50 and the light absorption layer 10 is disposed above the light transmission layer 20. The light absorption layer 10 has a plurality of projecting structures 10a disposed at one side opposite from the side where the light transmission layer 20 is disposed. In FIG. 1, the projecting structures 10a are convex and have a substantially polygonal shape. The projecting structures 10a may have substantially hemispheric (FIG. 2A), spheroid (FIG. 2B), polygonal (FIG. 2C), or other shapes, or a combination of the aforementioned shapes. One of a plurality of light absorption elements 12 is disposed at about a focal region of each of the projecting structures 10a.

In operation, the light emission layer 50 emits internal light 40. In one embodiment, the light 40 is the light of an image. The light emission layer 50 may include the phosphor layers of a plasma display panel, the electroluminescent layer (EL) of an organic EL display, or other luminescent or phosphorous layers of a display device. The internal light 40 travels through the light transmission layer 20 to the light absorption layer 10. Much of the internal light 40 travels between the light absorption elements 12 of the light absorption layer 10 toward the exterior 2, while portions of the internal light 40 hit the light absorption elements 12 and are absorbed.

The light absorption layer 10 receives external light 30 from the exterior 2 at the projecting structures 10a. The convex aspect of the projecting structures 10a refracts the transmitted portion 32 of the external light 30 toward a focal region inside each of the projecting structures 10a. Hereinafter, references to external light 32 in a light absorption layer of the present invention refer to the portion of the external light 30 that is transmitted into the light absorption layer. In an alternative embodiment, the projecting structures 10a are hemispheric-shaped and thus refract the transmitted portion 32 toward a substantially small focal region for a wide angle of incidence of the external light 30 when compared to projecting structures having polygonal shapes.

Each of the light absorption elements 12 has a small horizontal cross sectional area and thus, most of the internal light 40 generated by the light emitting layer 50 passes through the light absorption layer 10. In one embodiment, the light absorption elements 12 are made of carbon black or black dye.

Additionally, the projecting structures 10a scatter some of the incident external light 30 to reduce glare caused by the reflection of the external light 30 off the surfaces of the projecting structures 10a.

Each of the projecting structures 10a may have a diameter D in a range from about 0.1~100 μm, preferentially 1~10 μm. In another embodiment, the projecting structures 10a have a diameter ranging from about 3~10 μm. The diameter d of the light absorption elements 12 may be up to one half of the diameter D of the projecting structures 10a in one embodiment. The diameter d of the light absorption elements 12 should be selected with respect to the diameter D of the projecting structures to achieve a balance between external light 30 absorbed by the light absorption elements 12 against the internal light 40 emitted by the light emission layer 50. That is, diameter d should be large enough to satisfactorily absorb an amount of external light 30 while at the same time being small enough not to block an excessive quantity of the internal light 40 emitted by the light emission layer 50. For example, the diameter d could be between $1/100$ to $1/2$ of the diameter D, preferentially between $1/5$ to $1/3$.

Figure 3:
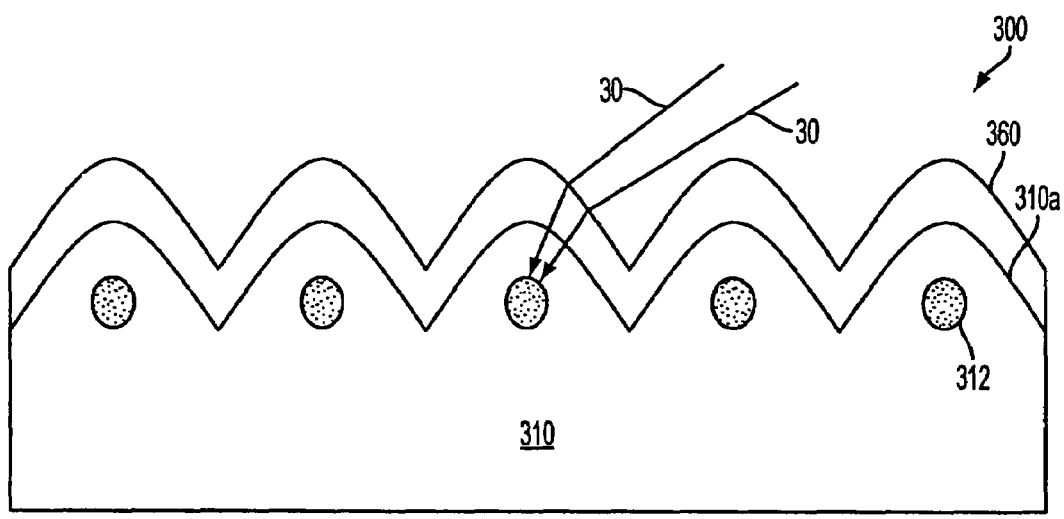
FIG. 3 is a cross sectional view of another embodiment of the invention including a thin film coating.

Another embodiment of the invention is shown in FIG. 3. In FIG. 3, an optical system 300 having a light absorption layer 310 is shown. The light absorption layer 310 has a plurality of projecting structures 310a and a plurality of light absorption elements 312 arranged in a manner similar to the light absorption layer 10 of FIG. 1. On the light absorption layer 310, there is a coat of thin film 360. The thin film 360 has substantially the same refractive index as the projecting structures 310a. The thin film 360 also substantially retains the shape of the projecting structures 310a and changes the location of the focal regions for each of the projecting structures 310a. As shown in FIG. 3, the external light 30 is refracted toward the light absorption elements 312 disposed substantially at a focal region. If the projecting structures 10a of FIG. 1 and the projecting structures 310a of FIG. 3 have the same dimensions, shape, and are made of the same material, the focal regions of the projecting structures 310a combined with the thin film 360 are closer to the surfaces of the projecting structures 310a than the focal regions of the projecting structures 10a. The thickness of the thin film 60 may be set to a desired amount to change the position of the focal region at about where the light absorption elements 312 are to be disposed.

Figure 4:
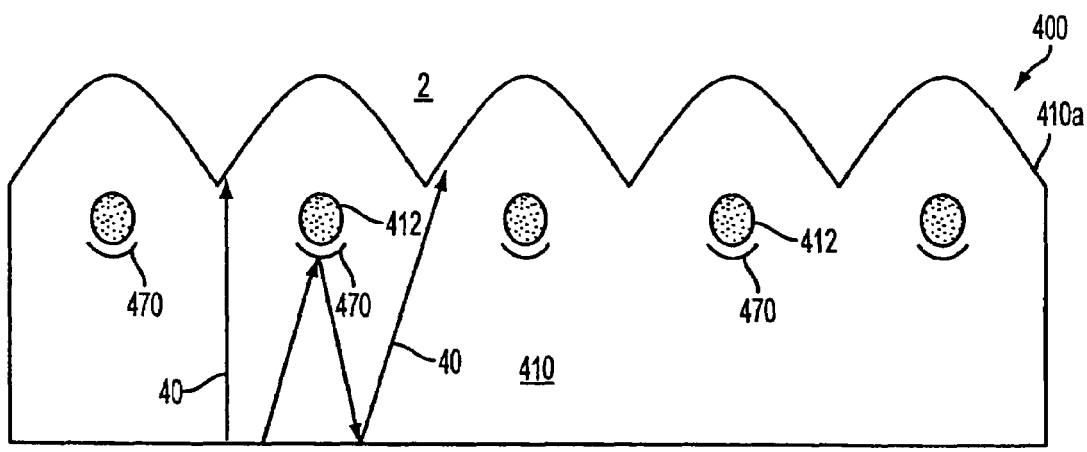
FIG. 4 is a cross sectional view of yet another embodiment of the invention utilizing a reflecting member.

Another aspect of the present invention is shown in FIG. 4. In FIG. 4, an optical system 400 includes a light absorption layer 410. The light absorption layer 410 has a plurality of projecting structures 410a and a plurality of light absorption elements 412 disposed in a manner similar to the light absorption layer 10 of FIG. 1. The light absorption layer 410 also includes a plurality of reflection members 470 wherein each of the plurality of reflection members 470 is disposed under a corresponding one of the light absorption elements 412. Internal light 40 traveling toward the light absorption elements 412 is reflected by the reflection members 470 to prevent the absorption of the internal light by the light absorption elements 412. Some of the internal light 40 reflected by the reflection members 470 travels toward a lower surface of the light absorption layer 410 where the light 40 is internally reflected back toward the projecting structures 410a to be transmitted to the exterior 2. Also, some of the light 40 may be reflected by the metal electrode under the light emission layer (not shown).

Figure 5:
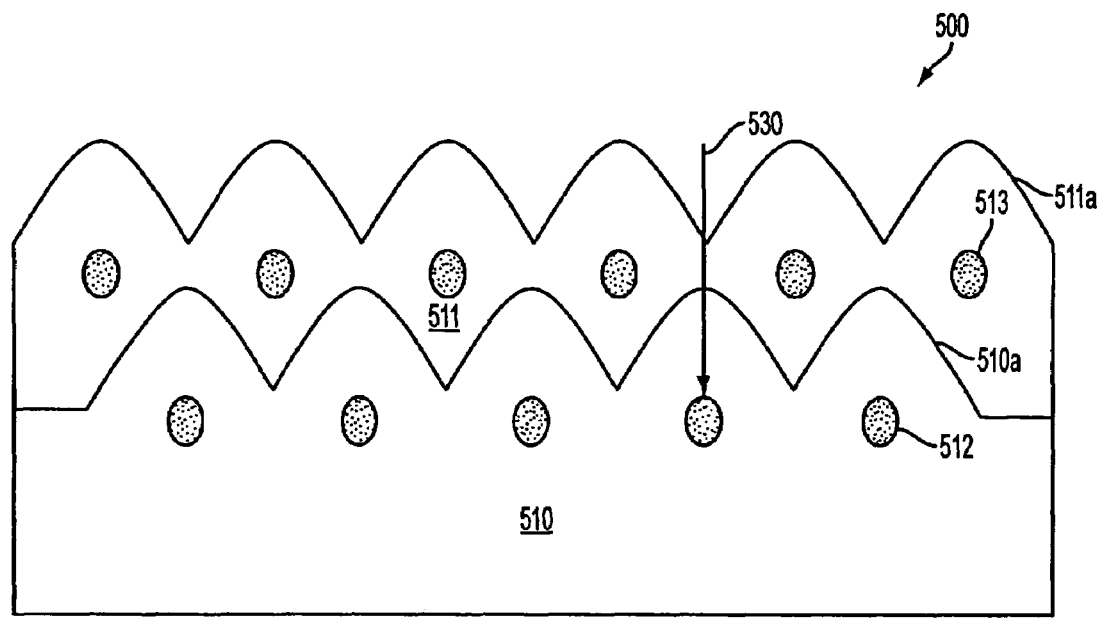
FIG. 5 is an embodiment of the present invention of a multilayer structure.

Another exemplary embodiment of the invention is shown in FIG. 5. The optical system 500 includes multiple layers of light absorption layers. In this embodiment, there is a first light absorption layer 510 and a second light absorption layer 511. The first light absorption layer 510 includes a plurality of projecting structures 510a and a plurality of light absorption elements 512 disposed at about the corresponding focal regions of projecting structures 510a. Likewise, the second light absorption layer 511 includes a plurality of projecting structures 511a and a plurality of light absorption elements 513 disposed at about the corresponding focal region of projecting structures 511a. The first and second light absorption layers 510, 511 are offset so the light absorption elements 513 are not disposed directly above the light absorption elements 512. Light 530 which travels between two adjacent light absorption elements 513, and thus is not absorbed by the light absorption elements 513, is absorbed by the light absorption elements 512 at the first light absorption layer 510.

Figure 6:
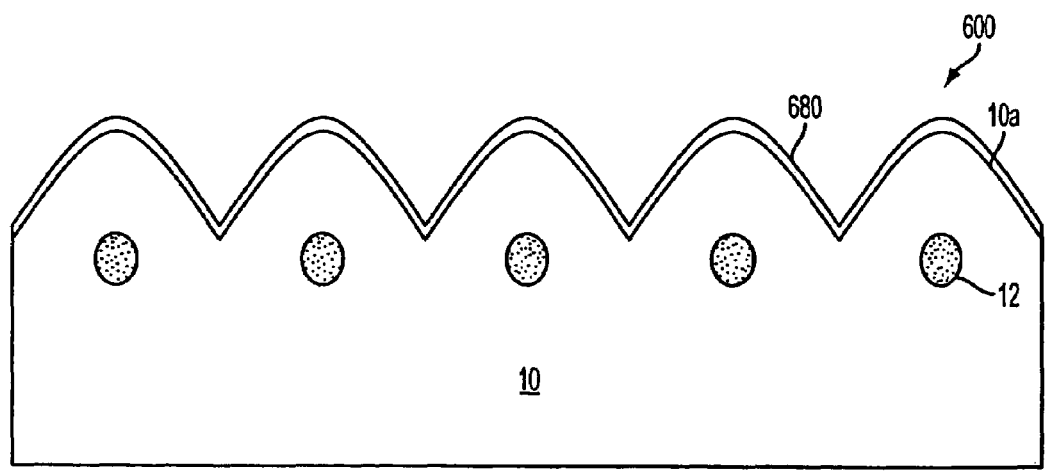
FIG. 6 is a cross sectional view of another embodiment of the present invention using an anti-reflection coating.

An optical system 600 is another exemplary embodiment of the present invention, as shown in FIG. 6. The optical system 600 includes the light absorption layer 10 having the light absorption elements 12 and the projecting structures 10a, of FIG. 1. The optical system 600 further includes an anti-reflection coating 680 disposed at surfaces of the projecting structures 10a where the external light 30 is incident. The anti-reflection coating 680 reduces glare, especially for projecting structures 10a having small or large diameters D, because large or small projecting structures 10a provide comparatively less diffusion to reduce glare. That is, there is a range in which the diameter D of the projecting structures 10a suitably diffuses external light 30 so that glare is minimized. When the projecting structures 10a have a diameter D above or below the range, less diffusion occurs and more glare exists.

Figure 7:
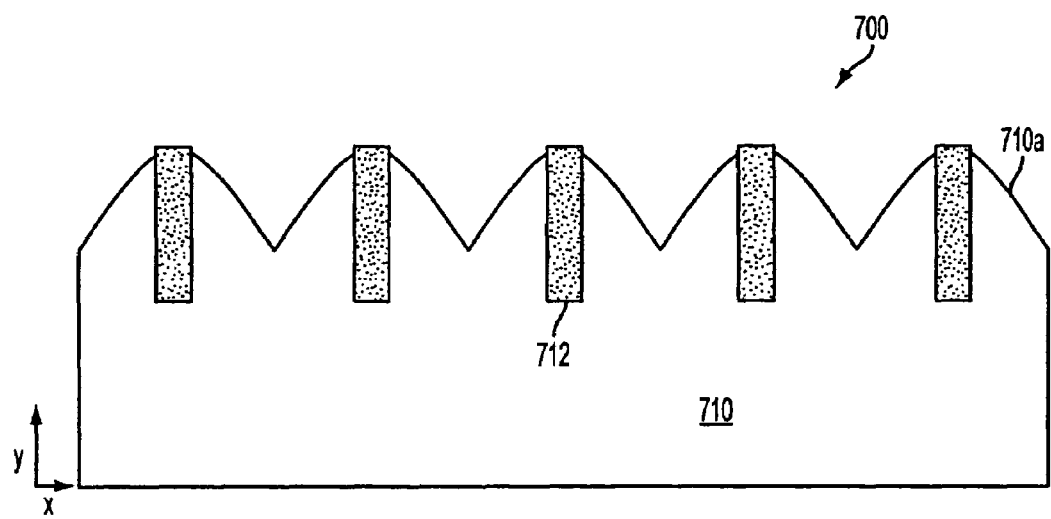
FIG. 7 is a cross sectional view of yet another embodiment of the present invention using columnar light absorption elements.

Alternatively, the light absorption elements may take on different shapes. FIG. 7 shows an optical system 700 including a light absorption layer 710. The light absorption layer 710 includes a plurality of projecting structures 710a and a plurality of light absorption elements 712. Each of the plurality of light absorption elements 712 has a substantially columnar shape and at least a portion of each of the light absorption elements 712 is disposed at about the focal region of each of the projecting structures 710a. In the optical system 700, the light absorption elements 712 are disposed at about the horizontal position of the focal regions of respective projecting structures in the x direction. With light absorption elements 712, precise vertical positioning of the light absorption elements 712 in the y direction is not necessary.

Figure 8:
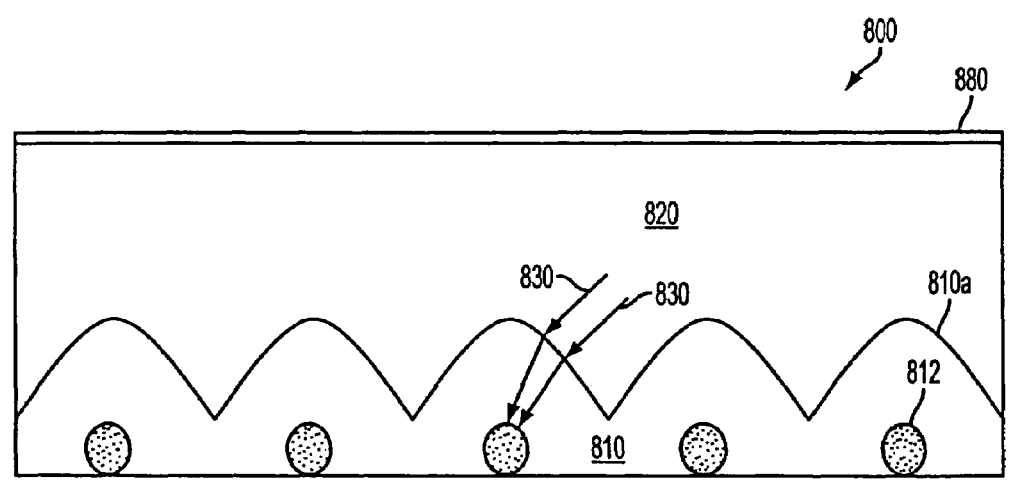
FIG. 8 is a cross sectional view of an aspect of the present invention with a light transmission layer disposed above projecting structures.

Another embodiment of the invention is shown in FIG. 8. The optical system 800 includes a light absorption layer 810 having a plurality of projecting structures 810a and a plurality of light absorption elements 812, wherein each of the light absorption elements 812 is disposed at about a focal region of a corresponding one of the plurality of projecting structures 810a. The optical system 800 also includes a light transmission layer 820 disposed above the light absorption layer 810. There is also an anti-reflection coating 880. The light transmission layer 820 has an index of refraction that is lower than the index of refraction of the material used for the projecting structures 810 to refract incident light 830 toward the light absorption elements 812.

In yet another embodiment, the size and/or the position of the projecting structures are non-uniform in the above embodiments to prevent interference effects caused by the regular reflection of external light off the projecting structures. Specifically, an optical system may have projecting structures whose diameters are non-uniform or light absorption elements whose diameters are non-uniform. In addition, the optical system may have a plurality of projecting structures which are not uniformly spaced apart or distributed.

Methods of making an optical system such as those shown in FIGS. 1-8 are described hereinbelow.

Figure 9A:
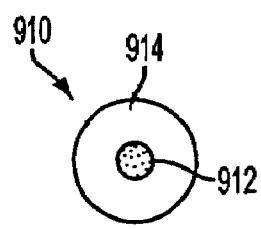
FIGS. 9A-B are cross sectional views of a microsphere 910 and a an embodiment of the present invention.
Figure 9B:
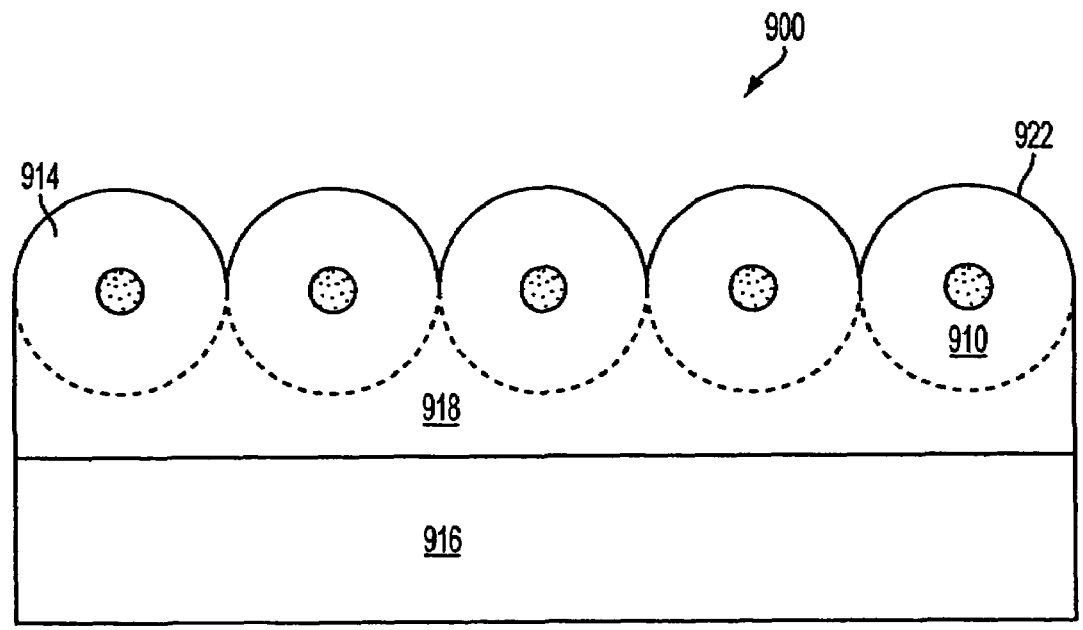

One method of making an optical system is shown in FIGS. 9A-B and 10A-D. FIG. 9A shows a microsphere 910 having a light absorption element 912 in its core. In this method, the spherical light absorption element 912, of about 1 µm diameter containing a light absorbing composition such as carbon black or black dye (which may be about 15% by volume), may be formed through emulsion polymerization of a transparent material such as methylmethacrylate (MMA). A shell 914 having a thickness of about 2 µm is then formed through emulsion polymerization as well on the light absorption element 912 using the transparent material used for the light absorption element 912 or a similar material. FIG. 9B shows a an optical apparatus 900 formed with a number of microspheres 910. The microspheres 910 are dispersed on a transparent film or substrate 916 coated with a coating material 918 such as MMA. After coating, the subsequent polymerization of coating material 918 has to be done to fix the position of the microspheres. Because the refractive indices of the shell 914, the microsphere 910, and the coating material 918 match, or are substantially the same, the lower surfaces) of the microspheres 910 in contact with the coating material 918 does not refract light. Therefore, only the hemispherical upper surface 922 refracts light. For emulsion polymerization, 1~5 wt % crosslinking agent might be used to prevent the microsphere 910 from swelling when dispersed into the coating material 918.

Figure 10A:
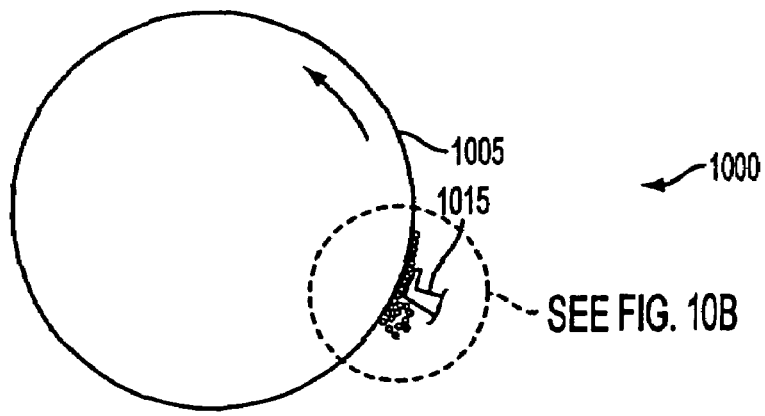
FIGS. 10A-E are views showing a method for making the present invention by using blade coating.
Figure 10B:
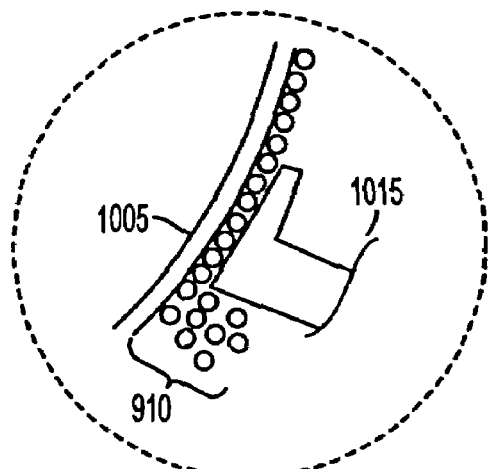

To distribute the microspheres 910 on a light transmission layer 1060 (FIG. 10C), blade coating may be used by using a microsphere layering apparatus 1000 shown in FIGS. 10A-E. The microsphere layering apparatus 1000 includes a rubber roller 1005 and a blade 1015. Initially, the rubber roller 1005 is rolled on microspheres 910. Through electrostatic forces, a layer of microspheres 910 adheres to the surface of the rolling rubber roller 1005 (FIG. 10A). The blade 1015 is applied to the rubber roller 1005 to allow a layer of microspheres 910 of desired thickness, e.g., a single layer of microspheres 910, to remain on the periphery of the rubber roller 1005 (FIG. 10B). In other words, the extraneous microspheres 910 are scraped off the rubber roller 1005 so that a single layer of microspheres 910 remains. The cross section A-A' of the blade 1015 as shown in FIG. 10B may have a groove (FIG. 10D) or a ditch-type (FIG. 10E) surface whose critical dimensions are comparable to that of the microspheres 910 in order to form the single layer effectively.

Figure 10C:
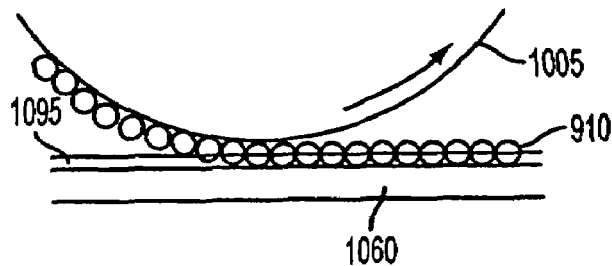
Figure 10D:
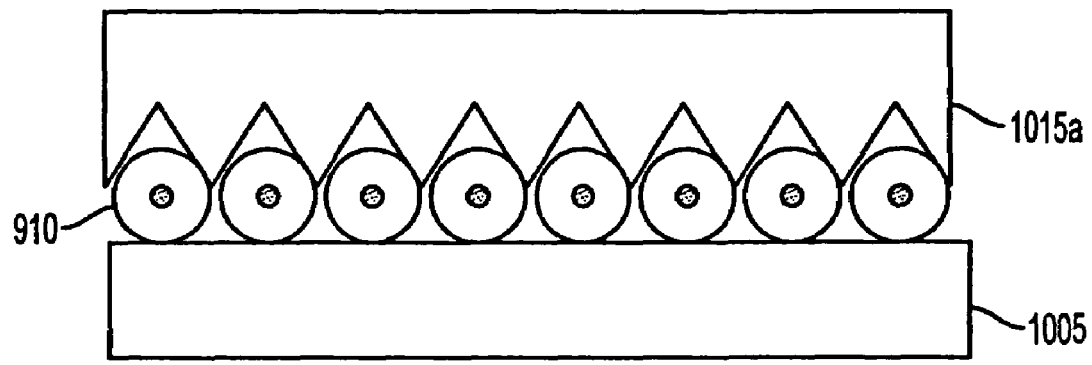
Figure 10E:
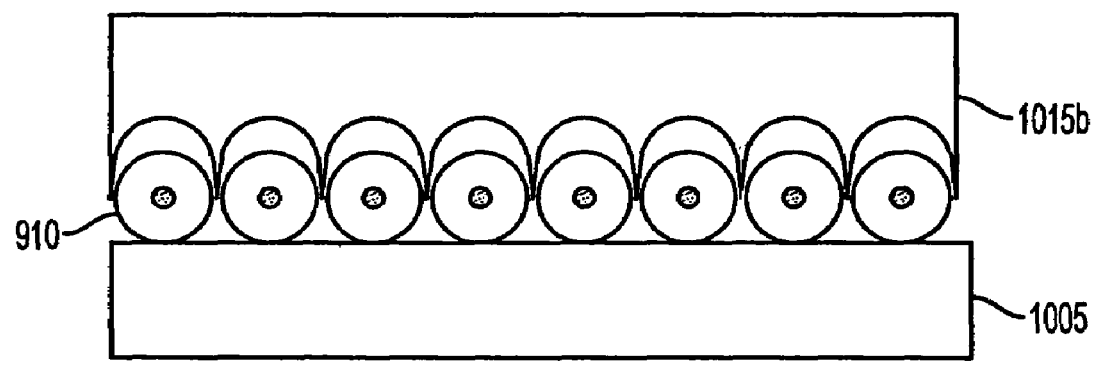

The rubber roller 1005 is then rolled on a light transmission layer 1020 coated with a film 1095, such as a soft polymer film or a monomer film (FIG. 10C). The microspheres 910 on the rubber roller 1005 adhere to the film 1095 to fall off the rubber roller 1005 (FIG. 10C) to form a layer of microspheres 910 on the film 1095 on the light transmission layer 1060. The film 1095 may be a MMA coating which is subsequently polymerized by heat or UV radiation. Thus, the MMA coating is stiffened to become PMMA having the same or nearly the same refractive index as the transparent material used to form the shell 914 on the light absorption element 912.

Figure 11:
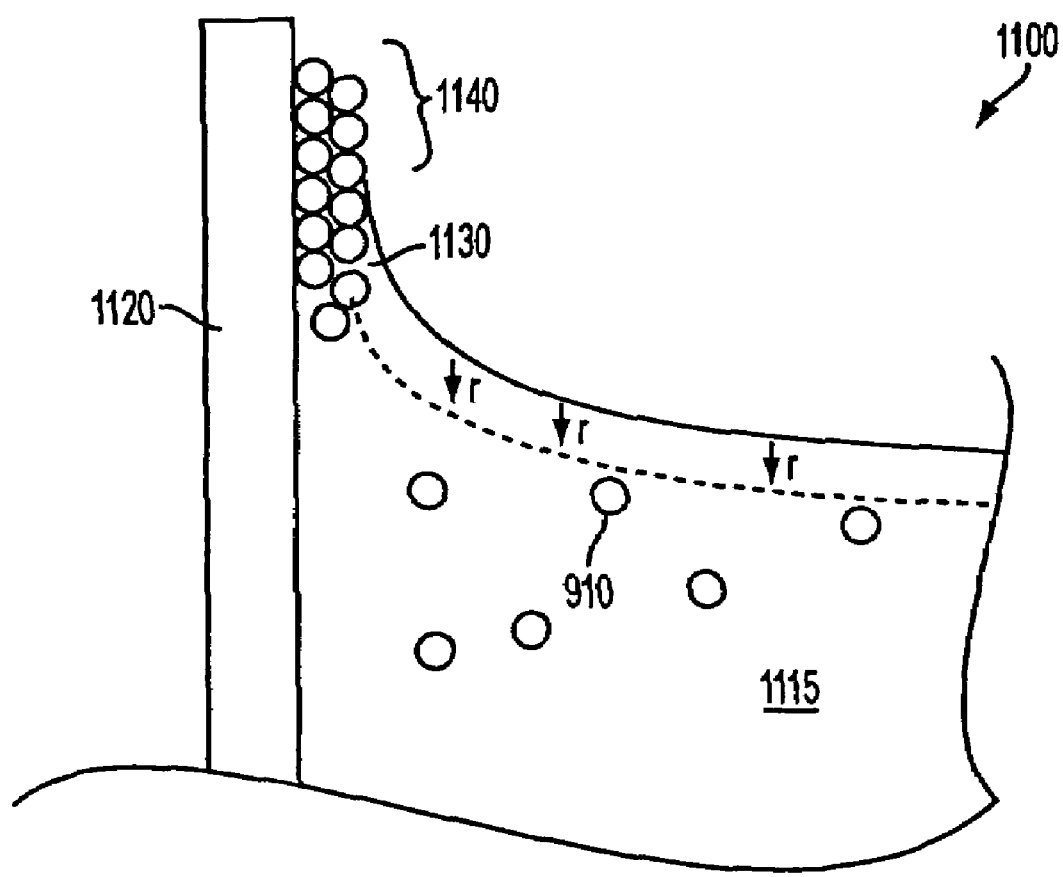
FIG. 11 is a cross sectional view of another method for forming a layer of microspheres.

Alternatively, a control flow system is shown in FIG. 11 showing a control flow system 1100 used to distribute microspheres 910 on the light transmission layer 1120. Initially, the microspheres 910 are suspended in a solution 1115. A light transmission layer 1120 is vertically disposed in the solution 1115. Due to capillary and interfacial forces, a meniscus 1130 is formed where the solution-air interface meets the light transmission layer 1120. By the action of capillary forces, microspheres 910 congregate toward the meniscus 1130. When the solution evaporates, the solution-air interface recedes in the r direction and a thin layer 1140 of microspheres 910 is formed on the light transmission layer 1120. Alternatively, in another aspect of the invention, light transmission layer 1120 is slowly withdrawn from the solution 1115 and the thin layer 1140 of microspheres 910 is formed on the light transmission layer 1120.

Figure 12A:
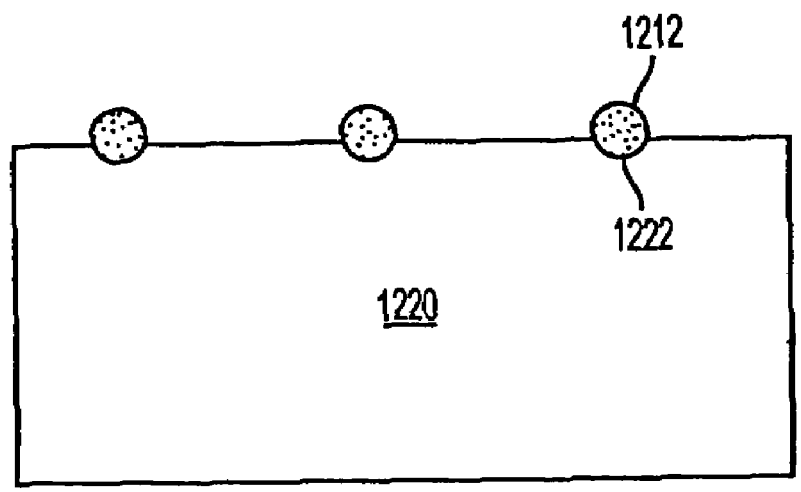
FIGS. 12A-B are cross sectional views of a method of making the present invention.
Figure 12B:
Figure 12B:
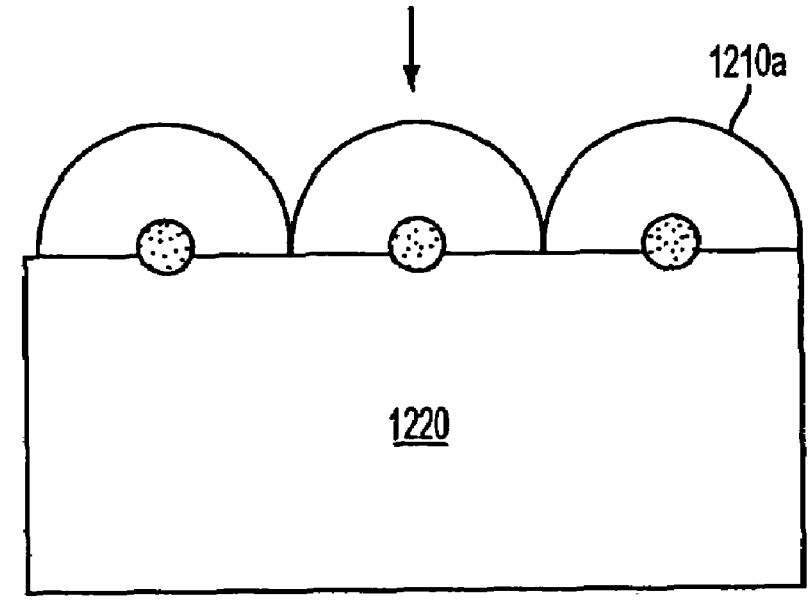

Alternatively, the optical system is made by scattering light absorption elements 1212 on a surface of a light transmission layer 1220 (FIG. 12A). The light transmission layer 1220 may have a pattern of indentations 1222 wherein the light absorption elements 1212 are disposed. This can be done by well-know photolithographic methods using photocurable resist material which may contain light absorbing materials such as carbon black or black dye, etc. A randomized pattern on the surface of the light transmission layer 1220 may be used to have a randomized distribution of the light absorption elements 1212. Subsequently, a coating of transparent material is applied on the light absorption elements 1212 to form projecting structures 1210*a* (FIG. 12B).

Figure 13C:
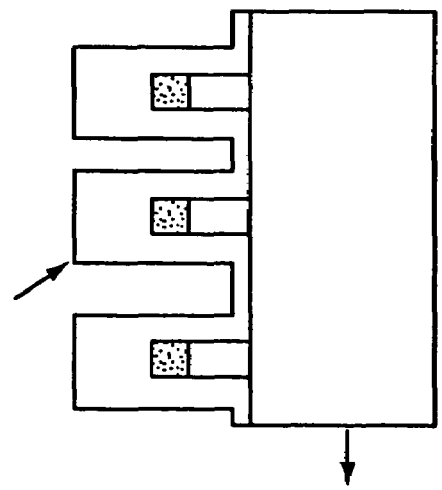
FIG. 13A-D are cross sectional views of another method of making the present invention.
Figure 13B:
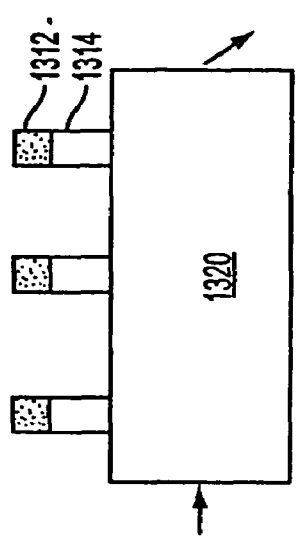
Figure 13D:
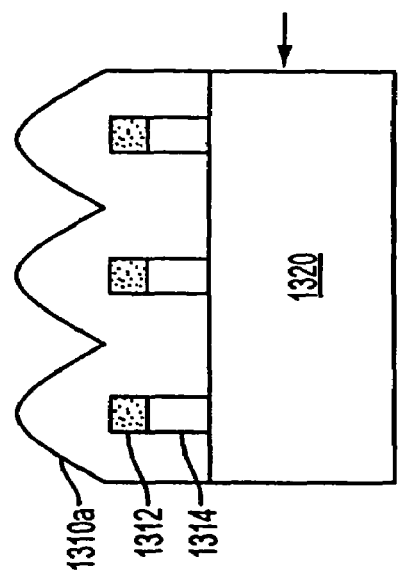
Figure 13A:
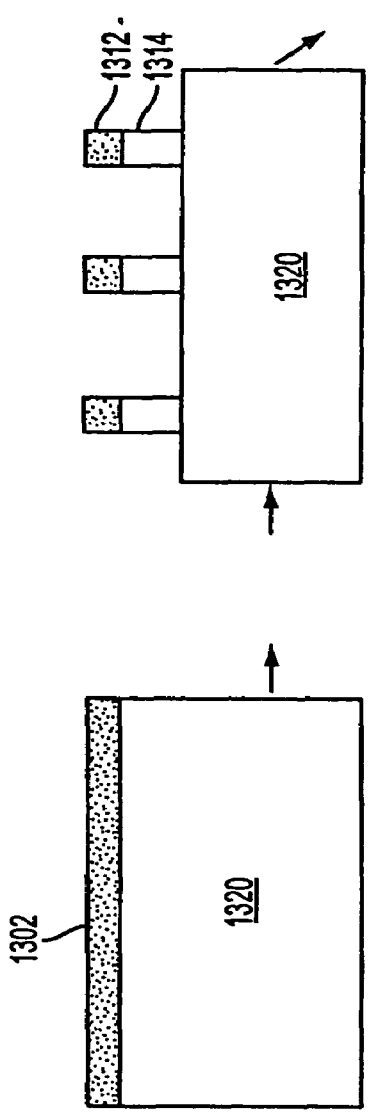

Yet another method of making the optical system is shown in FIGS. 13A-D. First, a transparent substrate 1320 is coated with a light absorption layer 1302 made of carbon black or black dye (FIG. 13A). Patterning of the light absorption layer 1302 and the transparent substrate 1320 is carried out by standard lithographic, molding, printing, or chemical etching techniques to form a plurality of light absorption elements 1312 disposed on a plurality of supports 1314 (FIG. 13B). Next, coating and polymerization of a transparent material such as MMA is performed over the light absorption elements 1312 and the transparent substrate 1320 and then cured to form the projecting structures 1310*a* (FIG. 13C, D). In this embodiment, the entire structure may tuned by altering the shape of the transparent material by using thermal baking and reflow (FIG. 13D). This can be done by elevating the temperature of the transparent material above the glass transition temperature of the transparent material for a desirable duration to form the shape of the projecting structures 1310*a* having a more desirable (e.g., round) shape to refract more external light toward the light absorption elements 1312.

Another method of making the optical system is shown in FIGS. 14A-D. In this method, a plurality of supports 1414 are formed on a transparent substrate 1420 using conventional techniques including lithography, chemical etching, or molding (FIG. 14A). Light absorption elements 1412 are formed on each of the plurality of supports 1414 (FIG. 14B). Then a coating of a transparent material such as MMA is applied to form the projecting structures 1410*a* (FIG. 14C, D). As with the method shown in FIGS. 13A-D, the tuning of the projecting structures 1410*a* may be carried out through thermal baking and reflow.

By using the present invention formed using the methods described above, the reflection of external light is reduced. When used in display devices, for example, brightness in the presence of external light source is enhanced dramatically when compared to existing technology.

The optical system of the present invention may be applied to display devices such as plasma displays, organic LEDs, etc. If the diameters of light absorption elements are 1/10 of the diameter of the projecting structures, 99% of the internal light is transmitted to the exterior. Light absorption elements whose diameters are 1/3 of the diameter of the projecting structures, transmit 89% of the internal light to the outside.

Additionally, the transmission of internal light is improved because total internal reflection is reduced and even suppressed by the shape of the projecting structures 10*a*. Hence, contrast ratio and brightness along with anti-glare and diffusing properties are improved in devices using the present invention. The present invention also reduces the degradation of organic materials in organic EL displays by absorbing UV light at the light absorption elements. Thus, when compared to circular polarizers, the amount of internal light may be transmitted to the exterior of a display, to enhance the brightness by a factor of almost two.

While the present invention has been particularly shown and described with reference to an exemplary embodiment thereof, it will be understood by those of ordinary skill in the art that various changes in form and details may be made therein without departing from the spirit and scope of the invention as defined by the appended claims and their equivalents.

What is claimed is:

1. An optical apparatus comprising:
    a plurality of light refracting structures having respective focal regions toward which incident light is refracted by the respective light refracting structure; and
    a plurality of light absorption elements disposed at the respective focal regions of the plurality of light refracting structures, wherein each of the plurality of light refracting structures substantially directs incident external light towards the plurality of light absorption elements and the incident external light is absorbed by the plurality of light absorption elements.

2. The optical apparatus of claim 1, wherein the plurality of light refracting surfaces are substantially planarly disposed.

3. The optical apparatus of claim 1, wherein each of the plurality of light refracting surfaces has a substantially convex shape.

4. The optical apparatus of claim 1, wherein each of the plurality of light refracting surfaces has a substantially hemispheric shape.

5. The optical apparatus of claim 1, wherein each of the plurality of light refracting surfaces has a substantially spheroid shape.

6. The optical apparatus of claim 1, wherein each of the plurality of light refracting surfaces has a substantially polygonal shape.

7. The optical apparatus of claim 1 further comprising a plurality of reflection elements disposed below said plurality of light absorption elements and a light emission layer disposed below said plurality of light refracting structures and said plurality of light absorption elements, wherein the light emission layer emits internal light and said plurality of reflection elements reflect internal light away from said plurality of light absorption elements.

8. A display device having a light emission layer, the display device comprising:
    a light absorption layer disposed to one side of the light emission layer, said light absorption layer comprising:
        a plurality of light refracting structures comprising a corresponding plurality of focal regions; and
        a plurality of light absorption elements, wherein each of the plurality of light absorption elements is positioned in a corresponding one of the plurality of focal regions, each of the plurality of light refracting structures substantially refract incident external light toward one of the plurality of light absorption elements, and the refracted incident external light is absorbed at the one of the plurality of light absorption elements.

9. The display device of claim 8, wherein each of the plurality of light refracting surfaces has a substantially convex shape.

10. The display device of claim 8, wherein each of the plurality of light refracting surfaces has a substantially hemispheric shape.

11. The display device of claim 8, wherein each of the plurality of light refracting surfaces has a substantially spheroid shape.

12. The display device of claim 8, wherein each of the plurality of light refracting surfaces has a substantially polygonal shape.

13. The display device of claim 8 further comprising a plurality of reflection elements disposed adjacent to said plurality of light absorption elements, wherein the light emission layer emits internal light and said plurality of reflection elements reflect internal light away from said plurality of light absorption elements.

14. The display device of claim 8, wherein the plurality of light absorption elements are randomly distributed in the light absorption layer.

15. A display device having a light emission layer, the display device comprising:
- a light absorption layer disposed to one side of the light emission layer, said light absorption layer comprising:
  a plurality of light refracting structures; and
- a plurality of light absorption elements, wherein each of the plurality of light absorption elements is positioned in a corresponding one of the plurality of light refracting structures and each of the plurality of light refracting structures substantially directs incident external light toward one of the plurality of light absorption elements positioned therein,
- wherein the light emission layer emits internal light, wherein the internal light travels toward said light absorption layer through the plurality of light refracting structures, and a diameter d of the light absorption elements is no more than one half of a diameter D of the light refracting structures.

16. A display device having a light emission layer, the display device comprising:
- a light absorption layer disposed to one side of the light emission layer, said light absorption layer comprising:
  a plurality of light refracting structures; and
- a plurality of light absorption elements, wherein each of the plurality of light absorption elements is positioned in a corresponding one of the plurality of light refracting structures and each of the plurality of light refracting structures substantially directs incident external light toward one of the plurality of light absorption elements positioned therein,
- wherein the diameter D of the light refracting structures have a range from about 0.1 μm to about 100 μm, and a diameter d of the light absorption elements is no more than one half of a diameter D of the light refracting structures.

17. A display device having a light emission layer, the display device comprising:
- a light absorption layer disposed to one side of the light emission layer, said light absorption layer comprising:
  a plurality of light refracting structures; and
- a plurality of light absorption elements, wherein each of the plurality of light absorption elements is positioned in a corresponding one of the plurality of light refracting structures and each of the plurality of light refracting structures substantially directs incident external light toward one of the plurality of light absorption elements positioned therein,
- wherein diameters of the plurality of light absorption elements are not uniform.

18. A display device having a light emission layer, the display device comprising:
- a light absorption layer disposed to one side of the light emission layer, said light absorption layer comprising:
  a plurality of light refracting structures; and
- a plurality of light absorption elements, wherein each of the plurality of light absorption elements is positioned in a corresponding one of the plurality of light refracting structures and each of the plurality of light refracting structures substantially directs incident external light toward one of the plurality of light absorption elements positioned therein,
- wherein the light absorption layer is a first light absorption layer, the display device further comprising a second light absorption layer disposed above said first light absorption layer, wherein a horizontal position of the plurality of light absorption elements of the first light absorption layer is offset from a horizontal position of the plurality of light absorption elements of the second light absorption layer.

19. A method of absorbing light, the method comprising:
- receiving first light at light refraction structures as received light;
- transmitting at least a portion of the received first light as transmitted light;
- refracting said transmitted light toward corresponding focal areas of said light refraction structures; and
- absorbing said transmitted light at the corresponding focal areas.

20. The method of absorbing light of claim 19, wherein said light refraction structures are substantially planarly disposed.

21. The method of absorbing light of claim 19, wherein the operation of receiving first light comprises receiving said first light at one side of said light refraction structures, the method further comprising:
- receiving second light from another side of said light refraction structures; and
- reflecting a portion of second light traveling toward said focal areas away from said focal areas.

* * * * *